(12) United States Patent  (10) Patent No.: US 7,421,632 B2
Jordan et al.  (45) Date of Patent: Sep. 2, 2008

(54) MAPPING LOGIC FOR CONTROLLING LOADING OF THE SELECT RAM OF AN ERROR DATA CROSSBAR MULTIPLEXER

(75) Inventors: Stephen D. Jordan, Ft. Collins, CO (US); Joel Buck-Gengler, Longmont, CO (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 274 days.

(21) Appl. No.: 11/443,732

(22) Filed: May 31, 2006

(65) Prior Publication Data

US 2007/0283197 A1 Dec. 6, 2007

(51) Int. Cl.
*G01R 31/28* (2006.01)

(52) U.S. Cl. .................. 714/724; 702/118; 702/123

(58) Field of Classification Search ................ 324/761, 324/754; 702/104, 120, 118, 123; 714/742, 714/724
See application file for complete search history.

(56) References Cited

U.S. PATENT DOCUMENTS

| 6,130,546 | A  | * | 10/2000 | Azizi ......................... 324/761 |
| 6,671,844 | B1 | * | 12/2003 | Krech et al. ................ 714/736 |
| 6,963,208 | B2 | * | 11/2005 | Fukasawa et al. ........... 324/754 |
| 2002/0049554 | A1 | * | 4/2002 | Miller ......................... 702/104 |
| 2002/0173926 | A1 | * | 11/2002 | McCord ..................... 702/120 |

\* cited by examiner

*Primary Examiner*—David Ton
(74) *Attorney, Agent, or Firm*—Holland & Hart, LLP

(57) ABSTRACT

Methods and circuits for efficient configuration an error data crossover configuration circuit of an integrated circuit tester allows simultaneous DUT channel configuration for multiple identical DUTs for an error data control circuit.

6 Claims, 4 Drawing Sheets

MAPPING LOGIC FOR CONTROLLING LOADING OF THE SELECT RAM OF AN ERROR DATA CROSSBAR MULTIPLEXER

BACKGROUND OF THE INVENTION

Digital electronic devices utilize integrated circuits. Consumer expectations of high quality demands that extensive testing of the integrated circuits be performed prior to integration into an end device.

Integrated circuit manufacturers utilize large automated testers to perform entire suites of tests on integrated circuits prior to shipment. In general, a test to be performed on an integrated circuit device under test (hereinafter "DUT") consists of a set of pattern vectors that translate to stimulus voltage levels to be applied to input signal pins of the DUT according to pre-specified timing. Signals captured from output signal pins of the DUT are translated into corresponding response vectors that may be analyzed to determine whether the DUT is operating according to specification.

Integrated circuits typically include a number of signal pins used for input and output of "interesting" signals. The signal pins are typically electrically connected to test points on a board. For example, an integrated circuit may be mounted on a printed circuit board. Alternatively, an integrated circuit may be packaged and mounted in a handler (e.g., a socket) for testing. Sockets also exist for integrated circuit dies that are not yet packaged, and even (in the form of a translator board) for the semiconductor wafer on which the integrated circuit is manufactured is not yet even diced. A tester traditionally provides a set of tester interface pins which are designed to electrically connect, typically through a test fixture, to the test points on the handler. As stated previously, the test points are electrically connected to signal pins of the DUT. The conductive paths between the test points up to and including the signal pins of the DUT are traditionally called the "DUT channels".

The tester generally provides a number of signal generating resources that may generate configurable signal levels with configurable timing. The tester also provides signal processing resources capable of converting signals generated by a DUT (e.g., the analog form) into a format (e.g., the digital form) readable by the tester. The signal processing resources may also be configurable. The tester may be configured (by way of a set of relays) to electrically connect any tester resource to any tester interface pin. This process is referred to as "PE channel configuration". The electrical path between a given tester resource up to and including the tester interface pin that the resource is configured to connect to is referred to as a "pin electronics channel" (or "PE channel").

To test a DUT, the DUT is mounted on the tester such that the test points connected to DUT channels are probed by predetermined tester interface pins. The tester is configured to connect appropriate tester resources to each of the probed DUT channels by way of a PE channel. DUT channels electrically connect to PE channels in a one-to-one mapping. Various other configurations is required, for example specifying the DUT layout and setting up a given test, but ultimately the tester applies test vectors to, and receives test responses from, the DUT channels by way of the PE channels. Tester software may process the test results to determine whether or not the DUT passed the test.

Often, the tester hardware will include error capture functionality. This functionality may involve storage of error data received on certain PE channels. Memory that stores such error data is herein referred to as the Error Capture RAM (or simply "ECR"). In order to organize the information in the ECR into a useful format for later retrieval, error data from a given PE channel (which corresponds to a corresponding DUT channel or signal pin of the DUT) may be assigned to one or more predetermined bits in the ECR. However, because the tester is designed to test integrated circuit devices of varying designs, the tester must be configured at test setup time to instruct the tester which bits in the ECR correspond to which PE channels (and therefore, ultimately, which DUT channels). That is, data output from the PE channels is routed to various corresponding bits in the ECR according to user specification as set up during configuration of a given test. Typically, PE-channel-to-ECR-channel configuration is performed by specifying an association of each pin of the DUT to a corresponding ECR bit or bits (hereinafter "ECR channel").

As semiconductor devices become more complicated, the number of DUT channels that require probing is increasing, which increases the complexity of the PE channel configuration. In order to maximize throughput, today's testers often allow multiple DUTs to be tested simultaneously. This is achieved by designating different groups of pin electronics channels to service different DUTs mounted in the tester. While this parallel test execution approach certainly improves over serial testing techniques, the tester configuration required during tester configuration and test setup remains lengthy. This is due to the traditional hardware-centric paradigm of configuring the tester which does not utilize any identification of particular DUTs in its associations between PE channels, tester resources, ECR bits, etc.

For example, referring back to the discussion of the ECR, in the traditional hardware-centric paradigm, PE-channel-to-ECR-channel configuration must still be performed by specifying an association of each pin of each DUT to a corresponding ECR channel, regardless of whether or not the DUTs to be tested are identical. In the typical manufacturing line case in which all of the multiple DUTs to be tested are identical, the advantages afforded by similarity of the DUT designs cannot be exploited if the tester configuration utilizes the DUT-centric approach.

It would therefore be useful to have a tester configuration approach that would allow PE-channel-to-ECR-channel configuration for all DUTs simultaneously, thereby reducing tester configuration time.

SUMMARY OF THE INVENTION

Embodiments of the invention include a method and circuit for loading a programmable Select RAM configured to store a plurality of select control settings each of which is selectable to be enabled as a select control signal for an error data crossover circuit configured to selectively connect respective ones of a plurality of PE channels to corresponding respective ones of a plurality of selected error capture circuit channels under the control of the select control signal, comprising associating DUT channels of respective DUTs with corresponding respective PE channels on which respective error data from the respective DUT channels are sourced; associating PE channels with corresponding respective ECR channels in an ECR; selecting at least one PE channel corresponding to a selected DUT channel; and loading an error data bit select configuration into the Select RAM in a position corresponding to the respective PE channel at a current Select RAM load address.

Embodiments of the invention also include a method and circuit for configuring a Select RAM for an error data crossover circuit of a tester that tests multiple identical devices under test (DUTs), the identical DUTs each comprising a number of identical corresponding DUT channels to be probed by the tester, each of the DUT channels mapped to and connecting to a different PE channel in the tester, the method comprising obtaining a configuration instruction, the configuration instruction comprising at least one DUT channel identifier field and a corresponding error memory bit identifier field, the at least one DUT channel identifier field corresponding to an associated DUT channel on each of the multiple identical DUTs; and simultaneously loading an error memory bit configuration indicated by the error memory bit identifier field into the Select RAM in respective positions corresponding to all respective PE channels associated with the DUT channel identified by the at least one DUT channel identifier field at a current ACAM Select RAM load address.

Embodiments of the invention also include an error data crossover configuration circuit which loads a programmable Select RAM configured to store a plurality of select control settings each of which is selectable to be enabled as a select control signal for an error data crossover circuit configured to selectively connect respective ones of a plurality of error data PE channels to corresponding respective ones of a plurality of selected error capture circuit channels under the control of the select control signal, comprising a programmable DUT-to-PE Channel Map which associates DUT channels of respective DUTs with corresponding respective error data PE channels on which respective error data from the respective DUT channels are sourced; a programmable ECR DUT Map which associates selected error data PE channels with corresponding respective ECR channels in an ECR; and a Select RAM Input Crossbar which selects the selected error data PE channels corresponding to a selected DUT channel.

Embodiments of the invention also include an error data crossover configuration circuit, comprising a crossbar having a plurality of crossbar data inputs connected to a respective plurality of error data pin electronics (PE) channels and having a plurality of crossbar outputs connected to a plurality of error capture circuit channels, the crossbar configured to selectively connect respective ones of a subset of the plurality of error data PE channels to corresponding respective ones of a subset of selected error capture circuit channels under the control of a select control signal; a programmable Select RAM configured to store a plurality of select control settings each of which is selectable to be enabled as the select control signal; a programmable DUT-to-PE Channel Map which associates DUT channels of respective DUTs with corresponding respective error data PE channels on which respective error data from the respective DUT channels are sourced; a programmable ECR DUT Map which associates selected error data PE channels with corresponding respective ECR channels in an ECR; and a Select RAM Input Crossbar which selects the selected error data PE channels corresponding to a selected DUT channel.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

Figure 1:
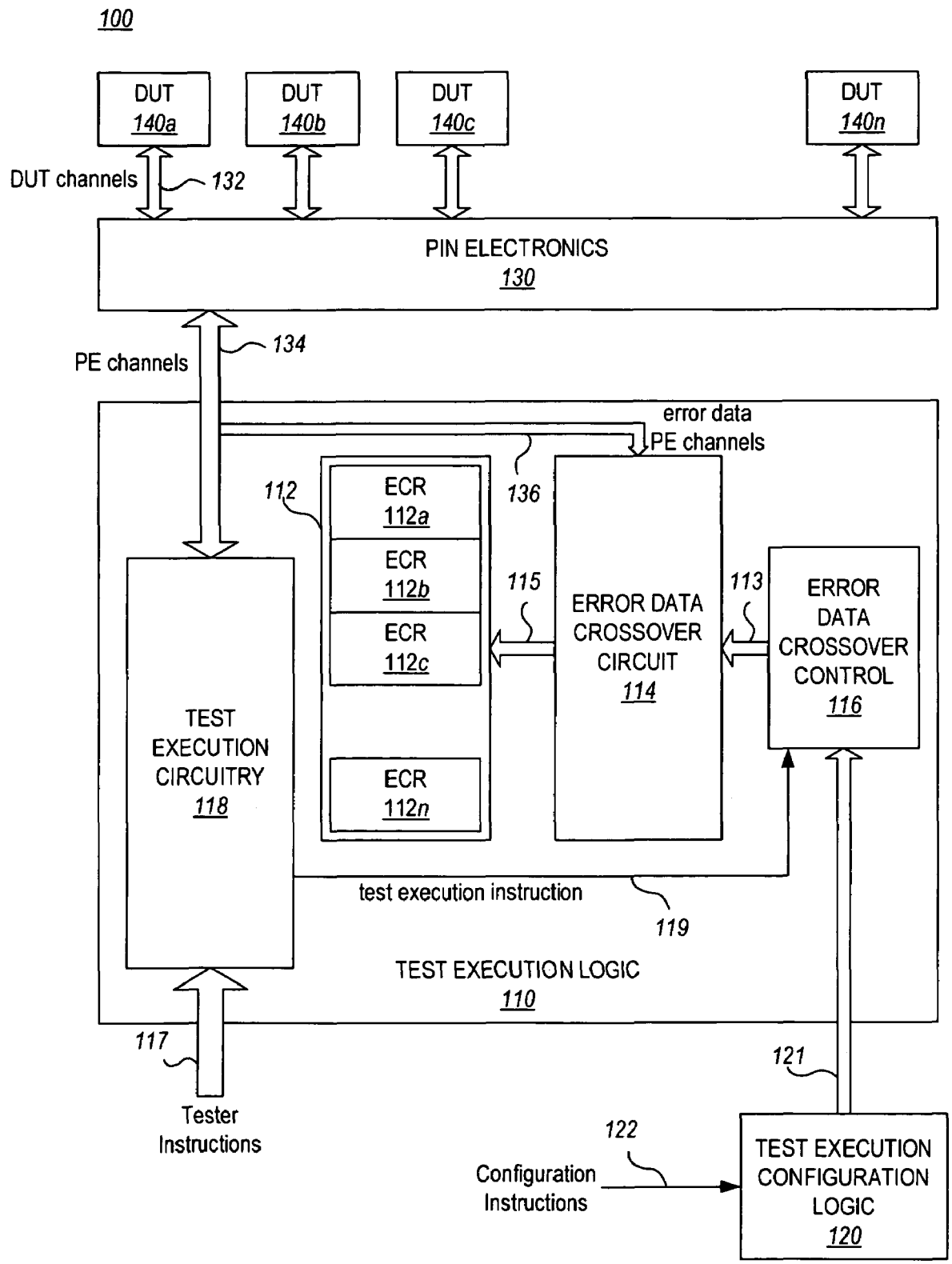
FIG. 1 is a block diagram of a test environment that tests a plurality of devices under test.

FIG. 1 shows a test environment for simultaneously testing a plurality of identical DUTs (140a through 140n). Stimulus signals may be applied to, and response signals may be received from, various DUT channels 132 by the DUTs 140a through 140n. Because the DUTs 140a through 140n are identical, the DUT channels 132 of each DUT correspond to identical corresponding DUT channels of every other identical DUT. However, each of the DUT channels 132 is connected to a different unique PE channel 134 in the tester.

DUT channels 132 on which error data is detected by read compare circuitry are herein termed "error data DUT channels". The DUT channel may include a pin, a pad, a solder bump, a PCB test point, a trace, or any other conductive component onto which error data is output by the DUT. PE channels 134 connected to error data DUT channels (by probes) are herein termed "error data PE channels". The connection of DUT channels 132 to PE channels 134 is performed in the pin electronics circuitry 130, typically using a set of programmable relays. The pin electronics 130 also includes circuitry necessary for generating signal level and timing and for converting signals received from DUT channels 132 into digital format.

The tester 100 includes test execution logic 110 which generates test vectors to apply to the DUTs and which receives test response vectors from the DUTs. The values and timing of the vectors to be applied to the DUTs is determined by test execution software, which may be configurable by a user (e.g., a test operator). The actual generation of the vectors and timing may be performed in the pin electronics module 130.

The test execution logic 110 is configurable to allow testing of DUTs implemented based on different DUT designs. The configuration of the test execution logic 110 is performed prior to execution of a test. The configuration of the test execution logic 110 is facilitated by test execution configuration logic 120, which is responsive to configuration instructions 122 to configure the test execution logic 110 specific to the particular DUT design of the DUTs to be tested. The test execution configuration logic 120 is not active during actual execution of tests on the DUTs by the test execution logic 110.

Embodiments of the invention take advantage of the identicality of the DUTs 140a through 140n in configuring the test execution logic 110. In particular, the test execution logic 110 may include an error capture circuit 112 which collects and stores error data received from the DUTs 140a through 140n. The error capture circuit 112 is commonly implemented using, among other circuit components, a random access memory (RAM) for storage of the error data, and is often referred to in the industry as an "Error Capture RAM", an "Error Catch RAM", or simply "ECR". The error capture circuit may be partitioned into a number of "virtual" error capture circuits (labeled 112a through 112n), one corresponding to each DUT being tested.

The test execution logic 110 may include an error data crossover circuit 114, operating under the control of an error data crossover control circuit 116, and having as input error data PE channels carrying error data from the DUTs. The error data crossover control circuit 116 operates in conjunction with a present test execution instruction 119 generated by test execution circuitry 118 based on received tester instructions 117 to dynamically select error data PE channels 136 relevant to the present test execution instruction 119 and to route the error data from these selected error data PE channels 136 to corresponding error capture circuit channels 115 associated with the selected error data PE channels in the error capture circuit 112. More particularly, the error data crossover circuit 114 operates to route each corresponding DUT channel of each respective DUT to the respective same ECR channel in the respective virtual ECR that corresponds to the respective DUT.

Embodiments of the invention include test execution configuration logic 120 which facilitates efficient configuration of the test execution logic associated with the aforementioned functioning of the error data crossover circuit 114. In particular, embodiments of the invention facilitate efficient configuration of the error data crossover control circuit 116 during test setup (i.e., prior to test execution).

Figure 2:
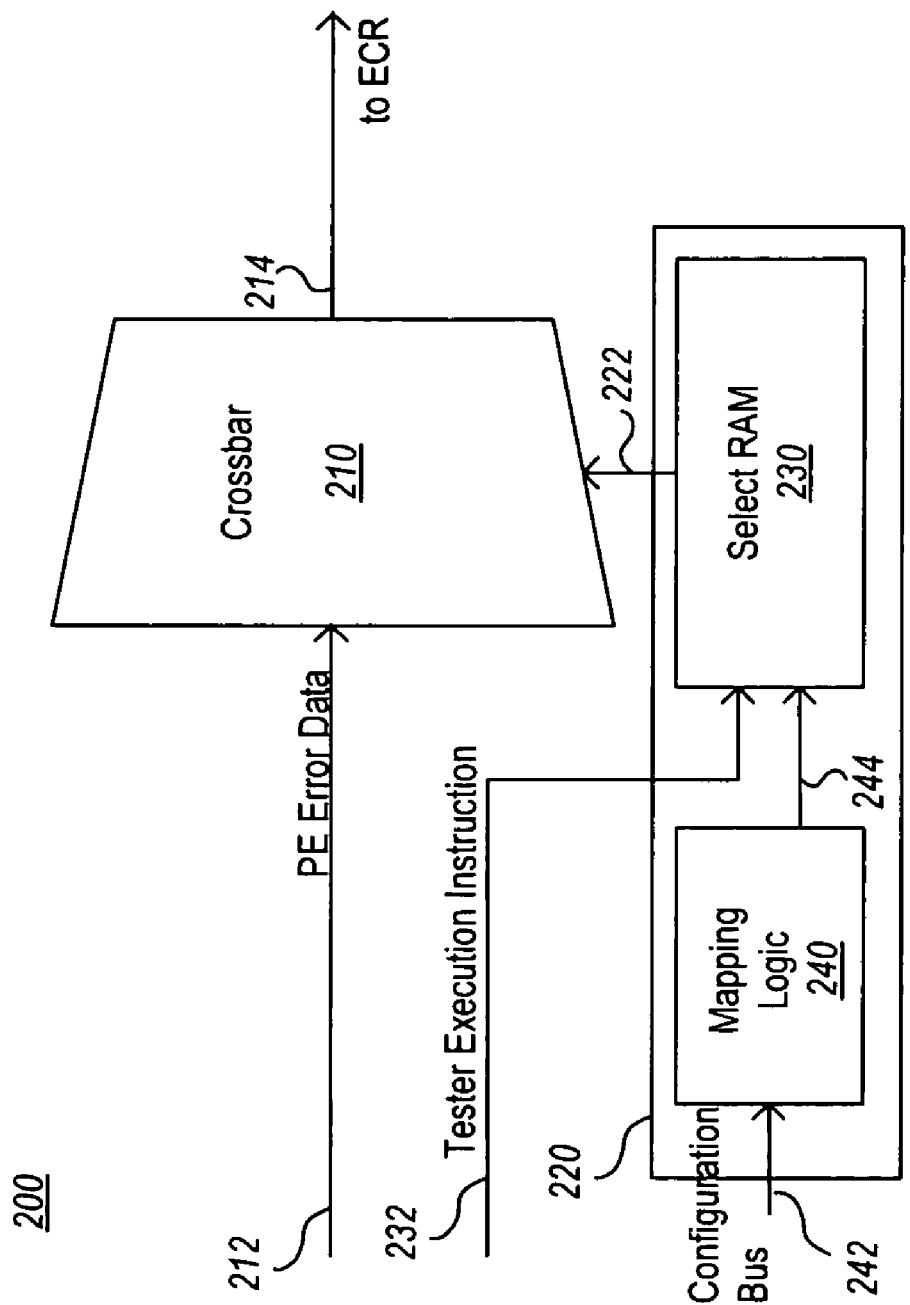
FIG. 2 is a high-level block diagram illustrating an embodiment of an error data control configuration circuit.

FIG. 2 is a high-level block diagram illustrating an embodiment 200 of a portion of tester circuitry that includes the functionality of the error data crossover circuit 114, associated control and control configuration circuitry. In this embodiment, the circuitry 200 is connected to receive at least the error data PE channels 136, relevant portions (which may be processed and decoded) of a present test execution instruction 119, and a configuration bus 242.

A tester may allow testing of DUTs that have a narrower external data bus than its internal data word width. For example, a tester may test DUTs that have memory cells arranged in 32-bit words, but the devices only have an 8-bit bus. This requires four bus read transactions to pull out the data associated with a single memory address. Since it is desirable that the tester stores the error data results in the word width of the internal memory cells of the DUTs, the error data results from all four read transactions are preferably stored in a single addressable location in the ECR. Accordingly, during any given test execution instruction 119, only a subset of the error data coming in from the error data PE channels 136 is routed to the ECR (thereby allowing the error data to be essentially "deserialized" as it enters the ECR. This tester architecture, which allows modifying the crossbar configuration on every test instruction, also allows support for testing DUTs which have multiple access modes. For example, some devices may be accessed in both an 8-bit mode and in a 16-bit mode. The result of the above requirements is that the crossbar must be switched from one instruction to the next.

In one embodiment that supports testing of DUTs having narrower external busses than internal busses, and/or that support testing of DUTs that have multiple access modes, the error data crossover circuit 114 must support reconfiguration on every bus transaction. Accordingly, in such an embodiment, the error data crossover circuit 114 is implemented with a crossbar 210 having as input all the error data PE channels 212 of the DUTs serviced by this crossbar 210. The crossbar 210 is a large multiplexer circuit. The outputs 214 of the crossbar 210 connect to selected error capture circuit channels in the error capture circuit 112 as selected by select control logic 220. The specific input-to-output connections provided in the crossbar 210 at any point in time are determined by select control 222 generated by the select control logic 220. The select control logic 220 in the illustrative embodiment is implemented as a random access memory (RAM), known as the Select RAM 230. Each addressable location in the Select RAM 230 contains a separate and complete crossbar select control setting. The test execution instruction 232 may be used as an address into the Select RAM to determine which Select RAM location is active. The active Select RAM location is output as the select control 222, which is connected to the selection control input of the crossbar 210. The crossbar 210 is responsive to the select control 222 to connect various ones of the error data PE channels 136 to various ones of the ECR channels 115. The contents of the active Select RAM 230 location therefore determine the connectivity in the crossbar 210, and ultimately which PE channel gets routed to which ECR bit.

The Select RAM 230 allows the crossbar select control to be configurable "on-the-fly", that is, to be configurable from one test execution instruction 119 to the next. Thus, which error data PE channel 136 is connected to which ECR channel 115 may change from one test execution instruction 119 to the next, thereby changing crossbar 210 connectivity at up to the frequency of test execution instruction processing.

The select control logic 220 includes Mapping Logic 240 for facilitating fast loading of the Select RAM 230 and simplifying user specification of inputs and outputs. It permits error data PE channels 136 to be specified in terms of DUT channels 132 instead of PE channels 134, and allows the crossbar output bit positions to be specified in terms of bit positions in virtual ECRs 112a-112n. The Mapping Logic 240 is configurable via a configuration bus 242.

During test execution only the Select RAM 230 and the Crossbar 210 are active. On each test execution instruction, one of the addressable locations in the Select RAM 230 is enabled and the contents of the enabled location is output as the select control 222, which configures the internal connectivity of the crossbar 201. On the next test execution instruction, a different Select Ram location may be selected, resulting in a different select control 222 setting for the crossbar 210.

Figure 3:
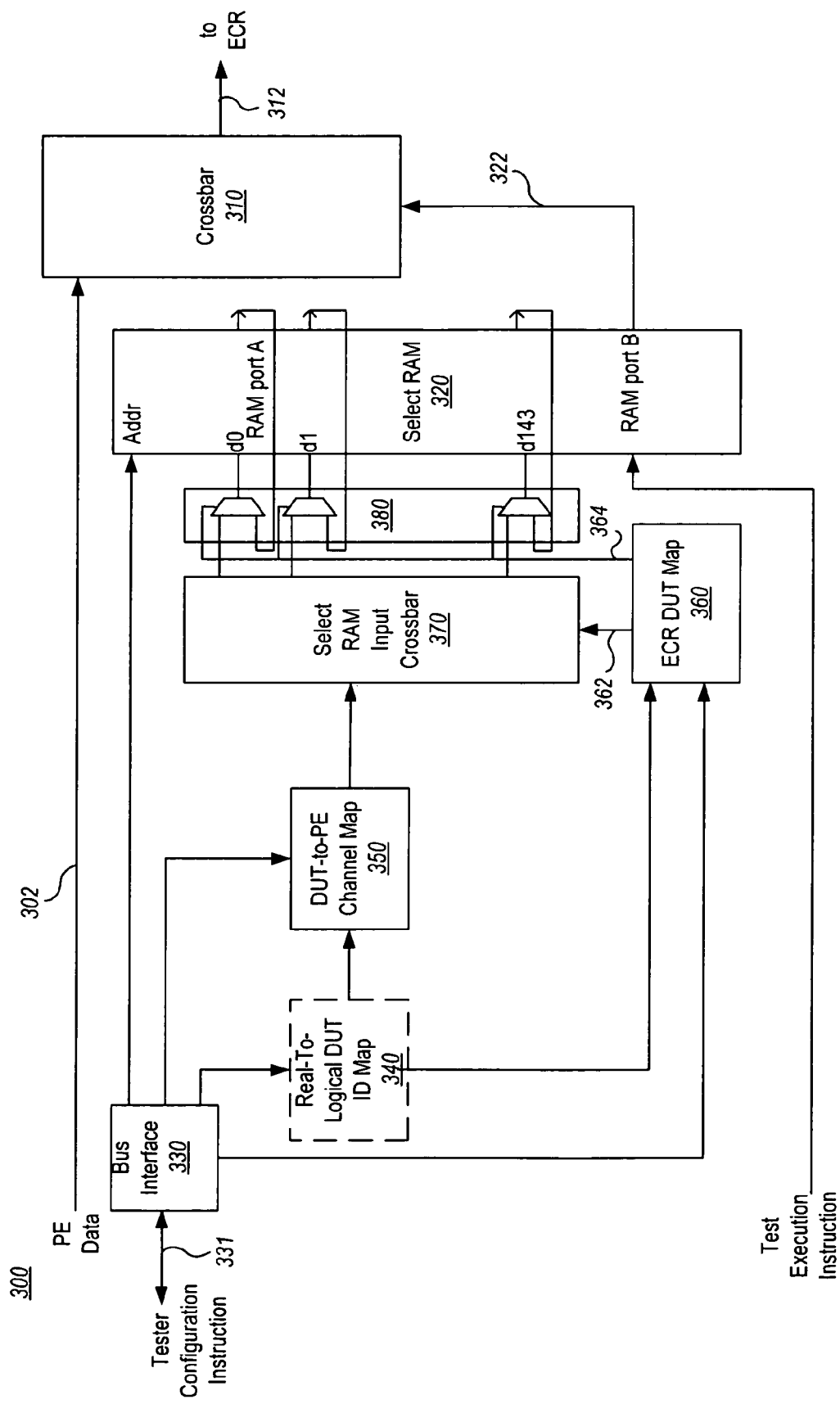
FIG. 3 is a block diagram of an embodiment of an error data crossover control circuit.

FIG. 3 is a more detailed block diagram of an embodiment of circuitry 300 that allows configuration of the error data crossover control. In this embodiment, a crossbar 310 is connected at its data inputs to error data PE channels 302 and selectively connects various ones of the error data PE channels 302 to corresponding ECR channels in the ECR (not shown) under the control of select control 322 from a Select RAM 320. As described previously, the Select RAM 330 is loaded with a number of complete select control settings that are selectively enabled as the select control 322 based on the present test execution instruction.

Circuit 300 includes a Real-to-Logical DUT ID Map 340, a DUT-to-PE Channel Map 350, an ECR DUT Map 360, and a Select RAM Input Crossbar 370. Configuration instructions are presented on configuration bus 331 and processed by bus interface 330. Configuration instructions are program instructions that allow programming of each of the maps 340, 350, and 360.

It is often true that large testers include multiple identical instances testing modules that may be combined to form a higher capacity test bed, or which may be partitioned into smaller capacity test beds. For example, a given tester may have a test bed that includes four quadrants. The four quadrants may be operated individually or combined to perform a test on a single larger device that requires more channels. Furthermore, each quadrant may be further partitioned to test multiple DUTs. For example, a given quadrant in a tester may allow testing of up to 36 32-pin DUTs; thus, if all four quadrants are used, and if the PE channels are independently sourced, the tester may thus allow testing of up to 144 32-pin DUTs. The tester circuitry of a given quadrant may be independent of the tester circuitry the other quadrants. The independent tester circuitry of each quadrant may be identical.

In terms of an embodiment of the present invention, a given error data crossbar circuit may service only a subset of the actual number of DUTs simultaneously tested by a given tester. If this is the case, then a Real-to-Logical DUT ID Map 340 is used to translate the unique global DUT ID into a logical (local) DUT ID for the particular set of DUTs serviced by the crossbar 310. The Real-to-Logical DUT ID Map 340 may be used when configuring the DUT-to-PE Channel Map 350 by determining which real DUT will be associated with which logical DUT slice (to be described hereinafter) within the DUT-to-PE Channel Map 350. This configuration step occurs infrequently in normal applications.

The Real-to-Logical DUT ID Map 340 also provides logical DUT ID values to the ECR DUT Map 360 during loading of the Select RAM 320.

The DUT-to-PE Channel Map 350 provides the PE channel numbers for each DUT associated with a given DUT channel number. The DUT-to-PE Channel Map 350 is used to convert the DUT channel number into a PE channel number. When loading Select RAM 320, the DUT-to-PE Channel Map 350 drives up to n PE channel numbers simultaneously, one for each logical DUT 140a-140n.

The ECR DUT Map 360 determines for which main Crossbar outputs (i.e. for which ECR input bits) the Select RAM 320 will be written when the DUT-to-PE Channel Map 350 is providing the PE channel numbers for a particular DUT channel number. Thus, the ECR DUT Map 360 provides the select signals for the Select RAM write enable control (implemented in the illustrative embodiment as a set of multiplexers at the inputs of the Select RAM 320). The ECR DUT Map 360 also controls the select values for the Select RAM Input Crossbar (SRIC) 370. These select values determine which SRIC input (selected error data PE channels by the DUT-to-PE Channel Map 350) will be selected for each active output of the SRIC 370.

Configuration of the Error Data Crossover Control is as Follows:

Real-to-Logical DUT ID Map

The first block to get configured is the Real-to-Logical DUT ID Map 340 (if the number of DUTs is greater than the number of DUTs serviced by the crossbar 310). Configuration of the Real-to-Logical DUT ID Map 340 typically occurs once each time a tester is configured to run a particular array of tests on a particular DUT type. Configuration of the Real-to-Logical DUT ID Map 340 therefore has very little impact on overall test time.

In one embodiment, the Real-to-Logical DUT ID Map 340 is partitioned into a number of sub-modules or "slices" equal to the number of identical DUTs that are to be serviced by the crossbar 310. In one embodiment, the Real-to-Logical DUT ID Map slices are configured at the same time that the PE channels are assigned to DUT channels in the pin electronics PE module (130 in FIG. 1). For example, in one embodiment, the PE module 130 maintains a Channel Map (CMAP) register for each PE channel. Each CMAP register gets loaded by the PE module controller with the real DUT ID number and DUT channel number associated with the respective PE channel. The Real-to-Logical DUT ID Map hardware monitors writes to the CMAP registers, and whenever a CMAP register is written, the Real-to-Logical DUT ID Map hardware assigns a Real-to-Logical DUT ID Map slice corresponding to the now logical DUT number to the real DUT number.

As an example, at a configuration reset, the Real-to-Logical DUT ID Map slices are cleared. Then the next CMAP register write will cause a Real-to-Logical DUT ID Map slice to get configured. For example, assume that the first CMAP write is to register CMAP_0 which corresponds to PE channel 0, and further assume that PE channel 0 gets written with (i.e., is assigned to) pin 5 of DUT #3. The Real-to-Logical DUT ID Map 340 detects this transaction and configures Real-to-Logical DUT ID Map slice 0 (now the logical DUT number) to be associated with DUT 3 (the real DUT number). Subsequent CMAP writes are also monitored. If any of the subsequent CMAP register writes assign PE channels to the same real DUT number, no action will be taken by the Real-to-Logical DUT ID Map 340 hardware. On the other hand, each subsequent CMAP register write that assigns a PE channel to a new DUT number will cause a new Real-to-Logical DUT ID Map slice to be associated with that DUT number. In this way all active unique DUT numbers (up to n) are assigned to unique Real-to-Logical DUT ID Map slices.

DUT-to-PE Channel Map

The DUT-to-PE Channel Map 350 is configured once each time a tester is configured to run a particular array of tests on a particular DUT type.

In one embodiment, entries in the DUT-to-PE Channel Map 350 are updated each time a PE channel is assigned to a particular DUT channel. For example, in one embodiment where the PE module 130 maintains a CMAP register for each PE channel, the DUT-to-PE Channel Map 530 monitors writes to the CMAP registers. Whenever a CMAP register is written, the DUT-to-PE Channel Map hardware detects this transaction and acts to configure the DUT-to-PE Channel Map 350.

The Real-to-Logical DUT ID Map 340 translates a given real DUT ID into a logical DUT ID and enables the appropriate slice of the DUT-to-PE Channel Map 350. In one embodiment, the DUT-to-PE Channel Map 350 is embodied as a group of simple lookup tables, one per logical DUT. In one embodiment, in the appropriate DUT-to-PE Channel Map slice (i.e., the slice currently enabled by the Real-to-Logical DUT ID Map 320), the PE channel number is stored in the lookup table corresponding to the logical DUT at the address which corresponds to the value of the DUT channel number.

In this embodiment, then, the total number of configuration bus transactions required to configure the Real-to-Logical DUT ID Map 340 and the DUT-to-PE Channel Map 350 is the number of error data PE channels serviced by the crossbar 310 (assuming each channel samples on a single clock edge). If the error data crossover control supports Double Data Rate (DDR), the total number of configuration bus transactions required to configure the Real-to-Logical DUT ID Map 340 and the DUT-to-PE Channel Map 350 doubles. DDR may be supported by sampling on both clock edges on each error data PE channel or by clocking the error data crossover control twice as fast. As described above, these maps 340 and 350 are configured relatively rarely.

ECR DUT Map

The ECR DUT Map 360 is configured with associations of ECR input bits (i.e., ECR channels) with logical DUT ID numbers. After being configured, the ECR DUT Map 360 controls which slices of the Select RAM input data word are to be enabled for writing and which output of the DUT-to-PE Channel Map 350 is driven to each Select RAM input slice.

In one embodiment, hardware associated with the ECR DUT Map 360 includes a DUT ECR Width register and a DUT ECR Position register. The DUT ECR Width register is used to specify how many crossbar output bits are used for every DUT. The Width register is written each time the ECR configuration changes. The Width register is written prior to writing to the DUT ECR Position Register. The DUT ECR Position register is used to specify the position of each DUT in the output bus of the crossbar 310. The DUT ECR Position register is written once for every DUT.

The ECR DUT Map is a group of identical logic modules. Each module corresponds to a bit in the ECR input (i.e., bit in the crossbar output) and drives two outputs. The first output 362 is the logical DUT ID associated with that ECR input bit. This output 362 determines which DUT-to-PE Channel Map output is selected by the Select RAM Input Crossbar 370. The second output 364 is a write enable for the Select RAM Input Crossbar 370 subword 380 and is activated when the associated ECR input bit is selected for Select RAM writing.

Select RAM Input Crossbar

The Select RAM Input Crossbar determines where each PE channel number will be written in the Select RAM. The Select RAM Input Crossbar 370 has one input per logical DUT and one output per ECR input bit. The select inputs are provided by the ECR DUT Map.

When loading the Select RAM, the DUT-to-PE Channel Map 350 provides the actual PE channel number to be associated with each logical DUT for the DUT pin being selected.

Select RAM Loading

Loading of the Select RAM 320 occurs at least once for every new test, which may be on the order of once a minute. Therefore, savings in number of bus transactions is quite high overall.

The DUT-to-PE Channel Map 350 is used when loading Select RAM 320. The user specifies the DUT pin number using configuration software which generates configuration instructions that are sent to the configuration circuitry over the configuration bus 331. Then, for every active DUT there is an active DUT-to-PE Channel Map (n active slices). Each slice of the DUT-to-PE Channel Map 350 converts the specified DUT pin number into its associated PE channel number, which is input to the Select RAM Input Crossbar 370, and sets the Select Control value that needs to be loaded into the Select RAM.

Routing the Select Control value to the correct location in the Select RAM word is accomplished by the Select RAM Input Crossbar 370. The routing is controlled by the ECR DUT Map 360. The ECR DUT Map 360 also enables slices of Select RAM for loading during every Select RAM Data register write.

For better understanding of the configuration process, first consider the following tester instruction for a prior art tester (note that the syntax may vary from tester to tester):

@ecam s2 {e2303:p3070, e2302:p3068, e2301:p3066, ... e1:p24, e0:p17}, where e corresponds to the particular ECR channel and p corresponds to its associated PE channel.

In prior art tester configuration, each ECR bit had to be explicitly mapped to the PE channel from which it received error data. In a tester that tests many tens or even hundreds of DUTs simultaneously, this requires the user to know and explicitly specify to the tester on the order of thousands of different PE channel-to-ECR-channel mappings—a tedious process at best. Furthermore, the above syntax also resulted in very long tester instruction statements (requiring a lot of typing), which is prone to user error.

Now, to illustrate the advantages of the present invention, consider the following example illustrating the Select RAM 320 loading process. Assume the configuration tester instruction file contains the following statements (where "ecam" refers to the configuration hardware of the error data capture circuit 300):

@ecam s1 {e7:x, e6:x, e5:x, e4:x, e3:d3, e2:d2, e1:d1, e0:d0};

@ecam s2 {e7:d9, e6:d8, e5:d7, e4:d5, e3:x, e2:x, e1:x, e0:x};

In these statements 'e' labels the virtual ECR bit position, 'd' labels the DUT pin, and 'x' indicates unknown (logical '1' will be driven). It is to be understood that the example pattern syntax used herein is presented by way of example only and not limitation.

In this example, the two ecam statements, if applied to the configuration bus 331 of the circuit 300 of FIG. 3, should cause the software to do the following:

write 0 to Select RAM Address register; "@ecam s1" setting will be stored here write 0x0700fe to Select RAM Data register for e7:x assignment (this will cause the hardware to set the mux select value in Select RAM for all error data multiplexer outputs assigned to a virtual ECR bit 7)

write 0x0600fe to Data register for e6:x
write 0x0500fe to Data register for e5:x
write 0x0400fe to Data register for e4:x
write 0x030003 to Data register for e3:d3
write 0x020002 to Data register for e2:d2
write 0x010001 to Data register for e1:d1
write 0x0000000 to Data register for e0:d0
write 1 to Address register; "@ecam s2" setting will be stored here
write 0x070009 to Data register for e7:d9
write 0x060008 to Data register for e6:d8
write 0x050107 to Data register for e5:d7
write 0x040105 to Data register for e4:d5
write 0x0300ff to Data register for e3:x
write 0x0200ff to Data register for e2:x
write 0x0200ff to Data register for e1:x
write 0x0200ff to Data register for e0:x The following two examples illustrate the time savings in bus transactions for two different scenarios.

In a first example, assume a 64 k NAND Flash Memory DUT having 8 shared data pins (multiplexed as address also) and 16 total pins, storing data internally at 16 bits wide.

Further assume a tester having 3072 PE channels and 2304 ECR channels per test site controller. PE channel configuration allows (total PE channels)/(pins per DUT)=192 DUTs to be simultaneously tested, but ECR configuration allows (total ECR channels)/(bits per DUT word width)=2304/16=144 DUTs to be simultaneously tested.

Without use of embodiments of the invention, every unique crossbar setting requires configuring 16 ECR inputs per DUT. This amounts to (ECR inputs)*(bits/input)*(# DUTs)/(bits/bus transaction)=16*12*144/32=864 bus transactions, and 12 bits/input are necessary to specify which PE channel of 3072 to select for each ECR output.

By contrast, with the use of embodiments of the invention, every unique crossbar setting requires configuring 16 ECR inputs, which amounts to (ECR inputs)*(bits/input)/(bits/bus transaction)=16*7/32=3.5->4 bus transactions. Additional setup transactions, which occur about 1/1000 times as often as the above, include DUT ID Map and DUT-to-PE Channel Map programming which amounts to one bus transaction per active output data crossbar channel (say, for purposes of example, 144 output crossbar bits), and ECR DUT Map programming which amounts to one bus transaction to specify DUT width, plus one transaction for each DUT (or 145 assuming a 144-bit output crossbar).

Assuming a minimum of two unique crossbar settings, there would be 864*2=1728 bus transactions without use of embodiments of the invention and 4*2=8 bus transactions with embodiments of the invention, plus the same 144+145 total additional rare configuration transactions.

In a second example, assume a 1 Gb NOR Flash Memory having 16 data pins, 26 address pins, and 6 control pins. Data is stored in 132-bit words internally. PE channel configuration allows 3072/48=64 DUTs to be simultaneously tested, and ECR configurations allows 2304/16=144 DUTs to be simultaneously tested.

Without use of embodiments of the invention, every unique crossbar setting requires configuring 16 ECR inputs per DUT, which amounts to (ECR inputs)*(bits/input)*(# DUTs)/(bits/bus transaction)=16*12*64/32=378 bus transactions.

With use of embodiments of the invention, every unique crossbar setting requires configuring 16 ECR inputs, which amounts to (ECR inputs)*(bits/input)/(bits/bus transaction) =16*7/32=3.5->4 bus transactions. Additional setup transactions, which occur about 1/1000 times as often as the above, include DUT ID Map and DUT-to-PE Channel Map programming which amounts to one bus transaction per active output data crossbar channel (say, for purposes of example, 64 output crossbar bits), and ECR DUT Map programming which amounts to one bus transaction to specify DUT width, plus one transaction for each DUT (or 65 assuming a 64-bit output crossbar).

Figure 4:
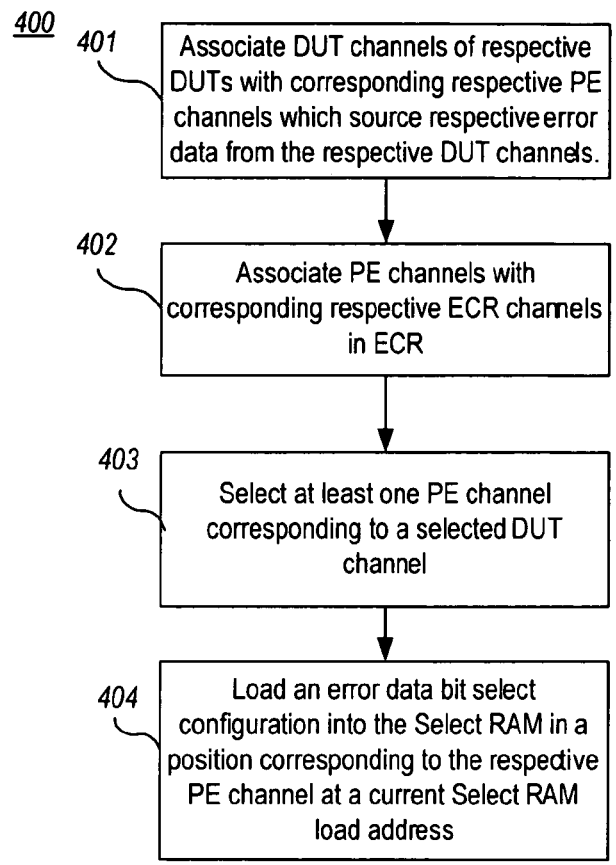
FIG. 4 is an operational flowchart illustrating an embodiment of a method for configuring an error data crossover circuit Select RAM.

FIG. 4 is an operational flowchart of an embodiment of a method for loading a programmable Select RAM configured to store a plurality of select control settings each of which is selectable to be enabled as a select control signal for an error data crossover circuit configured to selectively connect respective ones of a plurality of PE channels to corresponding respective ones of a plurality of selected error capture circuit channels under the control of the select control signal. The method 400 includes the steps of associating DUT channels of respective DUTs with corresponding respective PE channels on which respective error data from the respective DUT channels are sourced (step 401); associating PE channels with corresponding respective ECR channels in an ECR (step 402); selecting at least one PE channel corresponding to a selected DUT channel (step 403); and loading an error data bit select configuration into the Select RAM in a position corresponding to the respective PE channel at a current Select RAM load address (step 404).

Figure 5:
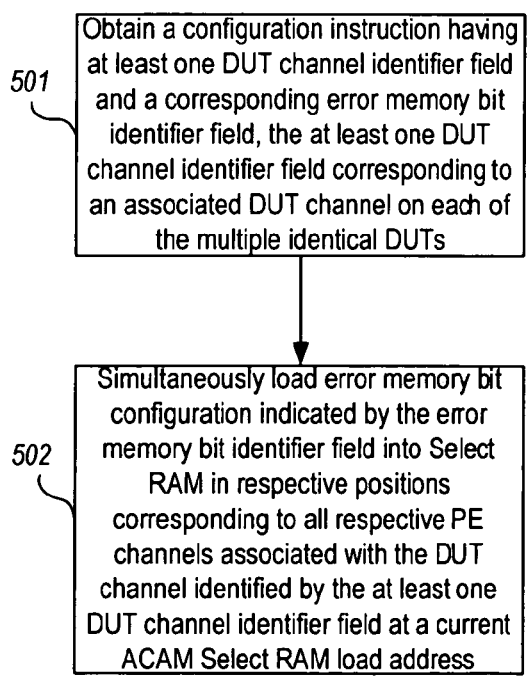
FIG. 5 is an operational flowchart of an embodiment of a method for configuring a Select RAM for an error data crossover circuit of a tester that tests multiple identical DUTs.

FIG. 5 is an operational flowchart of an embodiment of a method 500 for configuring a Select RAM for an error data crossover circuit of a tester that tests multiple identical devices under test (DUTs), the identical DUTs each comprising a number of identical corresponding DUT channels to be probed by the tester, each of the DUT channels mapped to and connecting to a different PE channel in the tester, the method comprising the steps of obtaining a configuration instruction, the configuration instruction comprising at least one DUT channel identifier field and a corresponding error memory bit identifier field, the at least one DUT channel identifier field corresponding to an associated DUT channel on each of the multiple identical DUTs (step 501); and simultaneously loading an error memory bit configuration indicated by the error memory bit identifier field into the Select RAM in respective positions corresponding to all respective PE channels associated with the DUT channel identified by the at least one DUT channel identifier field at a current ACAM Select RAM load address (step 502).

While it is preferable that the DUT ID Map, DUT-to-PE Channel Map, ECR DUT Map, and SRIC are implemented in hardware to save tester configuration time, those of skill in the art will appreciate that the functionality of these elements may alternatively be implemented in software or firmware, or a suitable combination of software/firmware and hardware. Thus, those of skill in the art will appreciate that the method and apparatus of the invention may be implemented by a computer or microprocessor process in which instructions are executed, the instructions being stored for execution on a computer-readable medium and being executed by any suitable instruction processor. Alternative embodiments are contemplated, however, and are within the spirit and scope of the invention.

Although this preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method for loading a programmable Select RAM configured to store a plurality of select control settings each of which is selectable to be enabled as a select control signal for an error data crossover circuit configured to selectively connect respective ones of a plurality of pin electronics (PE) channels to corresponding respective ones of a plurality of selected error capture circuit channels under the control of the select control signal, comprising:

associating device under test (DUT) channels of respective DUTs with corresponding respective PE channels on which respective error data from the respective DUT channels are sourced;

associating PE channels with corresponding respective error data circuit channels in an error data circuit; and selecting at least one PE channel corresponding to a selected DUT channel; and loading an error data bit select configuration into the Select RAM in a position corresponding to the respective PE channel at a current Select RAM load address.

2. A method for configuring a Select RAM for an error data crossover circuit of a tester that tests multiple identical devices under test (DUTs), the identical DUTs each comprising a number of identical corresponding DUT channels to be probed by the tester, each of the DUT channels mapped to and connecting to a different pin electronics (PE) channel in the tester, the method comprising:

obtaining a configuration instruction, the configuration instruction comprising at least one DUT channel identifier field and a corresponding error memory bit identifier field, each DUT channel identifier field corresponding to an associated DUT channel on each of the multiple identical DUTs; and simultaneously loading an error memory bit configuration indicated by the error memory bit identifier field into the Select RAM in respective positions corresponding to all respective PE channels associated with the DUT channel identified by the at least one DUT channel identifier field at a current Select RAM load address.

3. An error data crossover configuration circuit which loads a programmable Select RAM configured to store a plurality of select control settings each of which is selectable to be enabled as a select control signal for an error data crossover circuit configured to selectively connect respective ones of a plurality of pin electronics (PE) channels to corresponding respective ones of a plurality of selected error capture circuit channels under the control of the select control signal, comprising:

a programmable DUT-to-PE Channel Map which associates DUT channels of respective DUTs with corresponding respective PE channels on which respective error data from the respective DUT channels are sourced;

a programmable Error Channel DUT Map which associates selected PE channels with corresponding respective error data circuit channels in an error data circuit; and a Select RAM Input Crossbar which selects the selected PE channels corresponding to a selected DUT channel.

4. The error data crossover configuration circuit of claim 3, further comprising:

configuration instruction input means which receives configuration instructions and programs the DUT-to-PE Channel Map and the Error Channel DUT Map.

5. An error data crossover configuration circuit, comprising:

a crossbar having a plurality of crossbar data inputs connected to a respective plurality of pin electronics (PE) channels and having a plurality of crossbar outputs connected to a plurality of error capture circuit channels, the crossbar configured to selectively connect respective ones of a subset of the plurality of PE channels to corresponding respective ones of a subset of selected error capture circuit channels under the control of a select control signal;

a programmable Select RAM configured to store a plurality of select control settings each of which is selectable to be enabled as the select control signal;

a programmable DUT-to-PE Channel Map which associates DUT channels of respective DUTs with corresponding respective PE channels on which respective error data from the respective DUT channels are sourced;

a programmable Error Channel DUT Map which associates selected PE channels with corresponding respective error data circuit channels in an error data circuit; and a Select RAM Input Crossbar which selects the selected PE channels corresponding to a selected DUT channel.

6. The error data crossover circuit of claim 5, further comprising:

configuration instruction input means which receives configuration instructions and programs the DUT-to-PE Channel Map and the Error Channel DUT Map, the configuration instructions specifying a DUT channel and at least one error bit corresponding to a PE channel to which error data should be stored in the error data circuit.

* * * * *